United States Patent
Sewell

(10) Patent No.: US 9,536,632 B2
(45) Date of Patent: Jan. 3, 2017

(54) MECHANICALLY DEFORMED METAL PARTICLES

(71) Applicant: Richard Hamilton Sewell, Los Altos, CA (US)

(72) Inventor: Richard Hamilton Sewell, Los Altos, CA (US)

(73) Assignee: SunPower Corporation, San Jose, CA (US)

( * ) Notice: Subject to any disclaimer, the term of this patent is extended or adjusted under 35 U.S.C. 154(b) by 436 days.

(21) Appl. No.: 14/039,837

(22) Filed: Sep. 27, 2013

(65) Prior Publication Data
US 2015/0090326 A1    Apr. 2, 2015

(51) Int. Cl.
- *H01L 31/0224* (2006.01)
- *H01B 1/02* (2006.01)
- *H01L 31/068* (2012.01)
- *H01L 31/0745* (2012.01)

(52) U.S. Cl.
CPC ............... *H01B 1/023* (2013.01); *H01B 1/02* (2013.01); *H01L 31/022441* (2013.01); *H01L 31/0682* (2013.01); *H01L 31/0745* (2013.01); *Y02E 10/547* (2013.01)

(58) Field of Classification Search
CPC ............... H01L 31/022425; H01L 21/022441; H01L 31/18
See application file for complete search history.

(56) References Cited

U.S. PATENT DOCUMENTS

| | | | | |
|---|---|---|---|---|
| 2002/0106447 A1* | 8/2002 | Lindstrom | ........... | H01G 9/2031 427/126.3 |
| 2007/0290578 A1* | 12/2007 | Horie | ................... | H03H 9/0542 310/344 |
| 2009/0288697 A1* | 11/2009 | Shimizu | ................ | H05K 3/323 136/244 |
| 2012/0037216 A1* | 2/2012 | Kim | ........................ | H01B 1/22 136/252 |
| 2012/0142140 A1* | 6/2012 | Li | ..................... | H01L 31/02244 438/98 |
| 2013/0105806 A1 | 5/2013 | Liu et al. | | |
| 2013/0196465 A1 | 8/2013 | Dong | | |

FOREIGN PATENT DOCUMENTS

| | | |
|---|---|---|
| DE | 10020412 | 11/2001 |
| KR | 10-2012-0010920 | 2/2012 |
| KR | 10-2012-0092440 | 8/2012 |

OTHER PUBLICATIONS

International Preliminary Report on Patentability from PCT/US2014/057306 mailed Apr. 7, 2016, 9 pgs.
International Search Report and Written Opinion from PCT/US2014/057306 mailed Dec. 29, 2014, 13 pgs.

* cited by examiner

*Primary Examiner* — Susan D Leong
(74) *Attorney, Agent, or Firm* — Blakely Sokoloff Taylor Zafman LLP

(57) ABSTRACT

A solar cell can include a substrate and a semiconductor region disposed in or above the substrate. The solar cell can also include a conductive contact disposed on the semiconductor region with the conductive contact including deformed conductive particles.

3 Claims, 13 Drawing Sheets

MECHANICALLY DEFORMED METAL PARTICLES

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

DETAILED DESCRIPTION

Figure 1A:
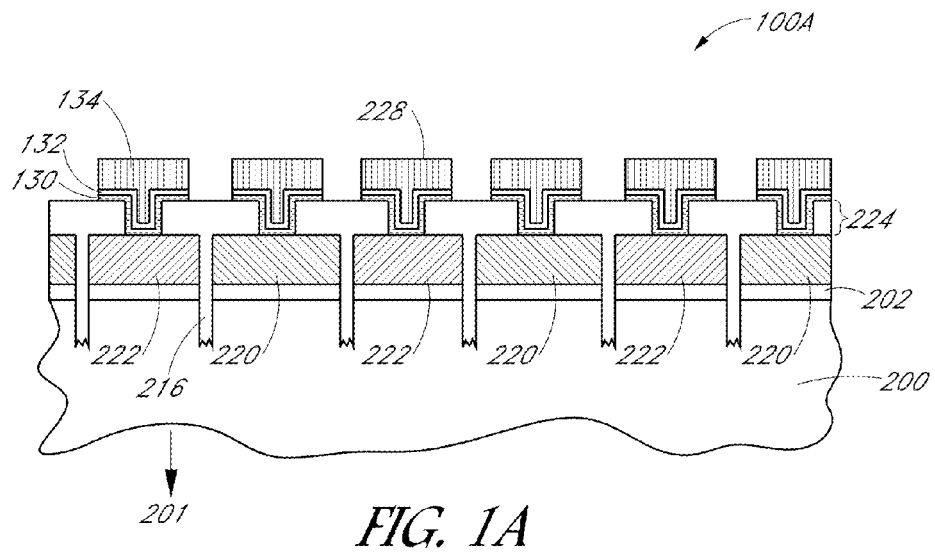
FIGS. 1A and 1C illustrate cross-sectional views of a portion of example solar cells having conductive contacts formed on emitter regions formed above a substrate, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" conductive portion of a solar cell does not necessarily imply that this conductive portion is the first conductive portion in a sequence; instead the term "first" is used to differentiate this conductive portion from another conductive portion (e.g., a "second" conductive portion).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Although many of the examples described herein are back contact solar cells, the techniques and structures apply equally to other (e.g., front contact) solar cells as well.

Moreover, although much of the disclosure is described in terms of solar cells for ease of understanding, the disclosed techniques and structures apply equally to other semiconductor structures (e.g., silicon wafers generally).

Solar cell conductive contacts and methods of forming solar cell conductive contacts are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

This specification first describes example solar cells that can include the disclosed conductive contacts, followed by a more detailed explanation of various embodiments of conductive contact structures. The specification then includes a description of an example method for forming the disclosed conductive contacts. Various examples are provided throughout.

In a first example solar cell, metal particles (e.g., from a metal paste, a metal powder, etc.) are used to fabricate contacts, such as back-side contacts, for a solar cell having emitter regions formed above a substrate of the solar cell. For example, FIG. 1A illustrates a cross-sectional view of a portion of a solar cell having conductive contacts formed on emitter regions formed above a substrate, in accordance with an embodiment of the present disclosure.

Referring to FIG. 1A, a portion of solar cell 100A includes patterned dielectric layer 224 disposed above a plurality of n-type doped polysilicon regions 220, a plurality of p-type doped polysilicon regions 222, and on portions of substrate 200 exposed by trenches 216. Conductive contacts 228 are disposed in a plurality of contact openings disposed in dielectric layer 224 and are coupled to the plurality of n-type doped polysilicon regions 220 and to the plurality of p-type doped polysilicon regions 222.

In one embodiment, the plurality of n-type doped polysilicon regions 220 and the plurality of p-type doped polysilicon regions 222 can provide emitter regions for solar cell 100A. Thus, in an embodiment, conductive contacts 228 are disposed on the emitter regions. In an embodiment, conductive contacts 228 are back contacts for a back-contact solar cell and are situated on a surface of the solar cell opposing a light receiving surface (direction provided as 201 in FIG. 1A) of solar cell 100A. Furthermore, in one embodiment, the emitter regions are formed on a thin or tunnel dielectric layer 202.

In some embodiments, as shown in FIG. 1A, fabricating a back-contact solar cell can include forming thin dielectric layer on the substrate. In one embodiment, a thin dielectric layer is composed of silicon dioxide and has a thickness approximately in the range of 5-50 Angstroms. In one embodiment, thin dielectric layer performs as a tunnel oxide layer. In an embodiment, the substrate is a bulk monocrystalline silicon substrate, such as an n-type doped monocrystalline silicon substrate. However, in another embodiment, the substrate includes a polycrystalline silicon layer disposed on a global solar cell substrate.

Trenches 216 can be formed between n-type doped polysilicon regions 220 and p-type doped polysilicon regions 222. Portions of trenches 216 can be texturized to have textured features. Dielectric layer 224 can be formed above the plurality of n-type doped polysilicon regions 220, the plurality of p-type doped polysilicon regions 222, and the portions of substrate 200 exposed by trenches 216. In one embodiment, a lower surface of dielectric layer 224 can be formed conformal with the plurality of n-type doped polysilicon regions 220, the plurality of p-type doped polysilicon regions 222, and the exposed portions of substrate 200, while an upper surface of dielectric layer 224 is substantially flat. In a specific embodiment, the dielectric layer 224 is an anti-reflective coating (ARC) layer.

A plurality of contact openings can be formed in dielectric layer 224. The plurality of contact openings can provide exposure to the plurality of n-type doped polysilicon regions 220 and to the plurality of p-type doped polysilicon regions 222. In one embodiment, the plurality of contact openings is formed by laser ablation. In one embodiment, the contact openings to the n-type doped polysilicon regions 220 have substantially the same height as the contact openings to the p-type doped polysilicon regions 222.

Forming contacts for the back-contact solar cell can include forming conductive contacts 228 in the plurality of contact openings 226 and coupled to the plurality of n-type doped polysilicon regions 220 and to the plurality of p-type doped polysilicon regions 222. Thus, in an embodiment, conductive contacts 228 are formed on or above a surface of a bulk N-type silicon substrate 200 opposing a light receiving surface 201 of the bulk N-type silicon substrate 200. In a specific embodiment, the conductive contacts are formed on regions (222/220) above the surface of the substrate 200.

Still referring to FIG. 1A, conductive contacts 228 can include a conductive layer of mechanically deformed metal particles 130. In one embodiment, deformed may be used herein to describe that the metal particles have been mechanically pressed into one another to the point of plastic deformation. In some embodiments, as shown in FIG. 1A, conductive contacts 228 can also include additional metal layers, for example, nickel (Ni) layer 132, and copper (Cu) layer 134. In some embodiments, the deformed metal particles 130 can be in contact with the emitter regions of the solar cell 100A. In some embodiments a metal layer (for example Aluminum) is deposited by sputtering or evaporation onto the solar cell as a first layer, and then metal particles are pressed onto this existing metal layer.

In some embodiments, deformed metal particles 130 can include aluminum (Al) particles, whether as pure Al particles or as an alloyed particle (e.g., Al/Silicon (Al/Si) alloy particles). In one embodiment, deformed metal particles 130 can also include non-Al metal particles. Such non-Al particles can be used in combination with or instead of Al particles. For example, in one embodiment, deformed metal particles 130 include just deformed Al particles, whereas in another embodiment, deformed metal particles 130 include deformed Al particles and deformed Cu particles (e.g., for solderability). Although much of the disclosure describes metal particles, note that in some embodiments, non-metal conductive particles (e.g., conductive carbon) may similarly be used in addition to or instead of metal particles. As described herein, metal particles may include Al, Al—Si alloy, tin, copper, and/or silver, among other examples.

In various embodiments, the deformed metal particles 130 can be particles that are deformed from a metal paste (e.g., a paste that includes the metal particles as well as a binder such that the paste is printable), from a metal powder (e.g., metal particles without a binder, a powder of Al particles, a layer of Al particles and a layer of Cu particles), or from a combination of metal paste and metal powder. In one embodiment using metal paste, paste may be applied by printing (e.g., screen printing, ink-jet printing, etc.) paste on the substrate. The paste may include a solvent for ease of delivery of the paste and may also include other elements, such as binders or glass frit.

Figure 5A:
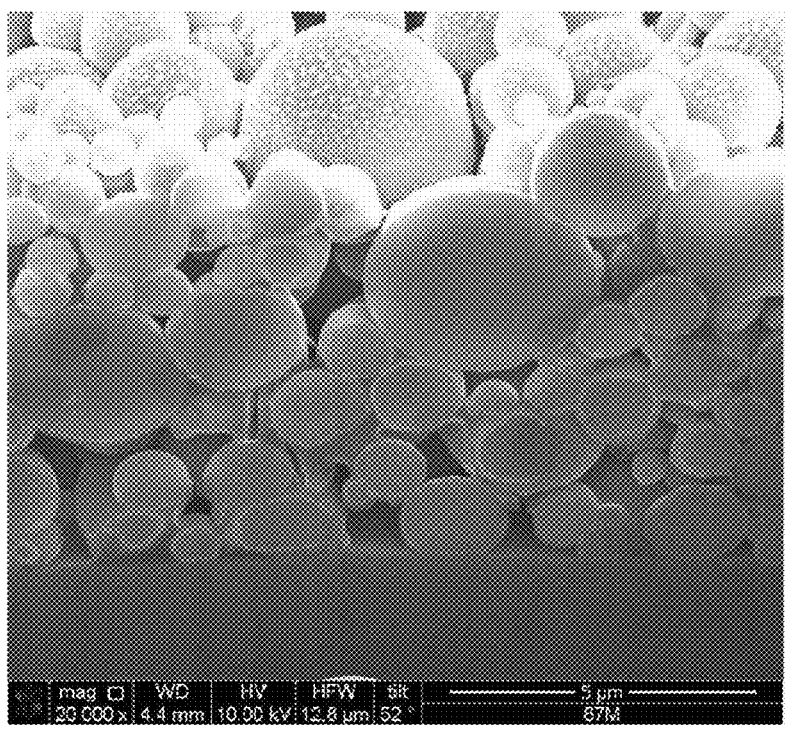
FIGS. 5A-5E illustrate microscopic views of cross sections of a conductive contact, according to some embodiments.
Figure 5B:
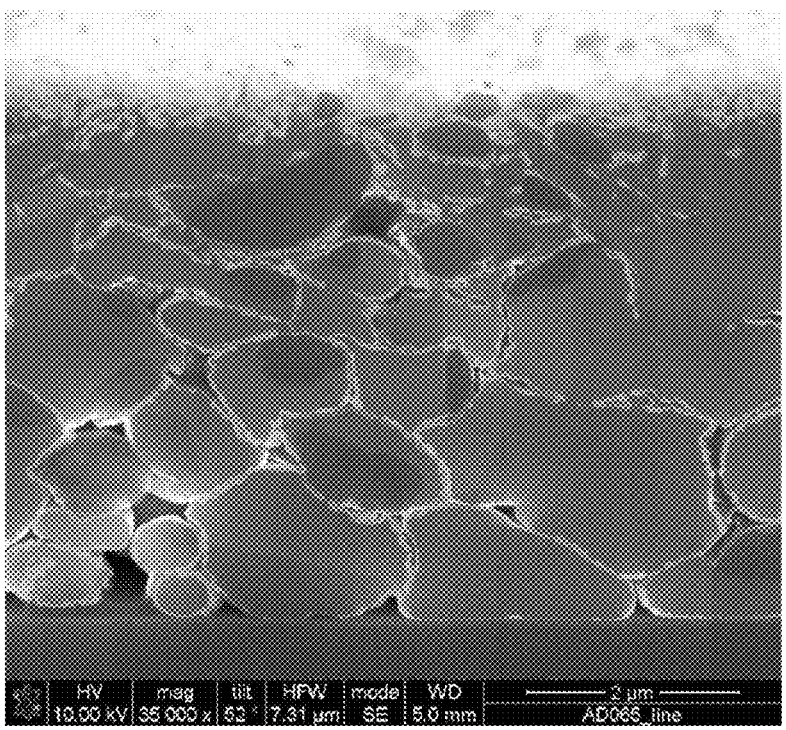
Figure 5C:
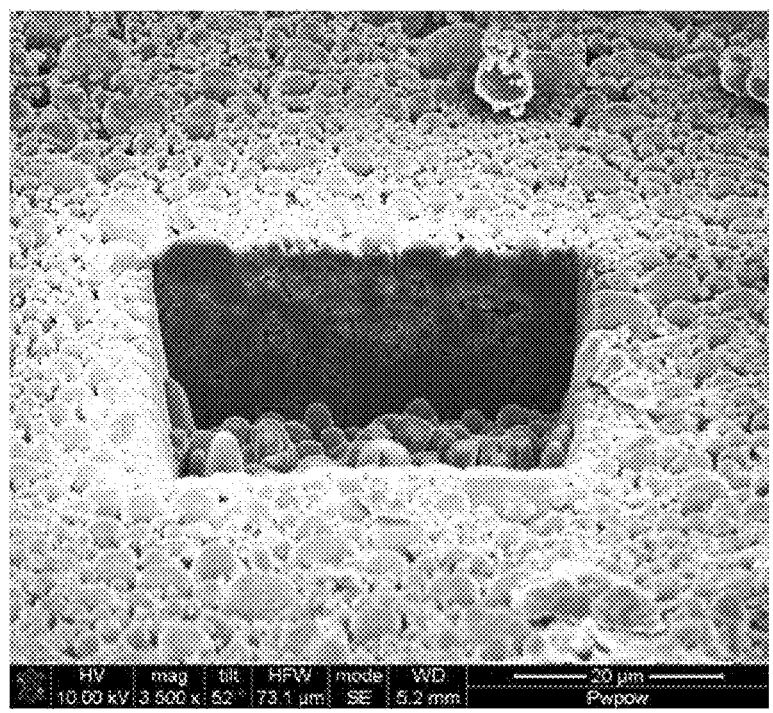
Figure 5D:
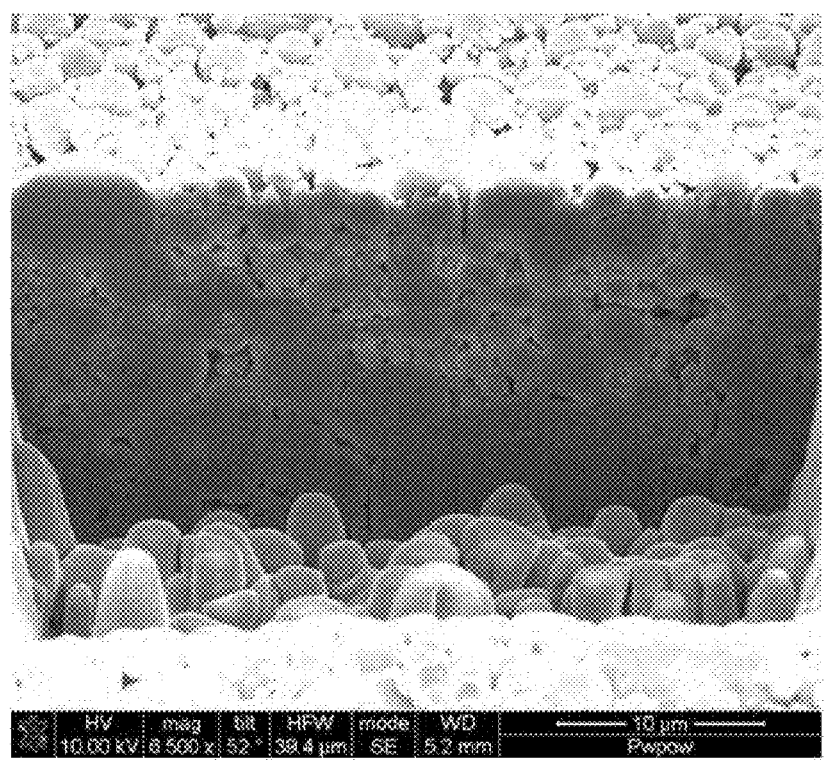
Figure 5E:
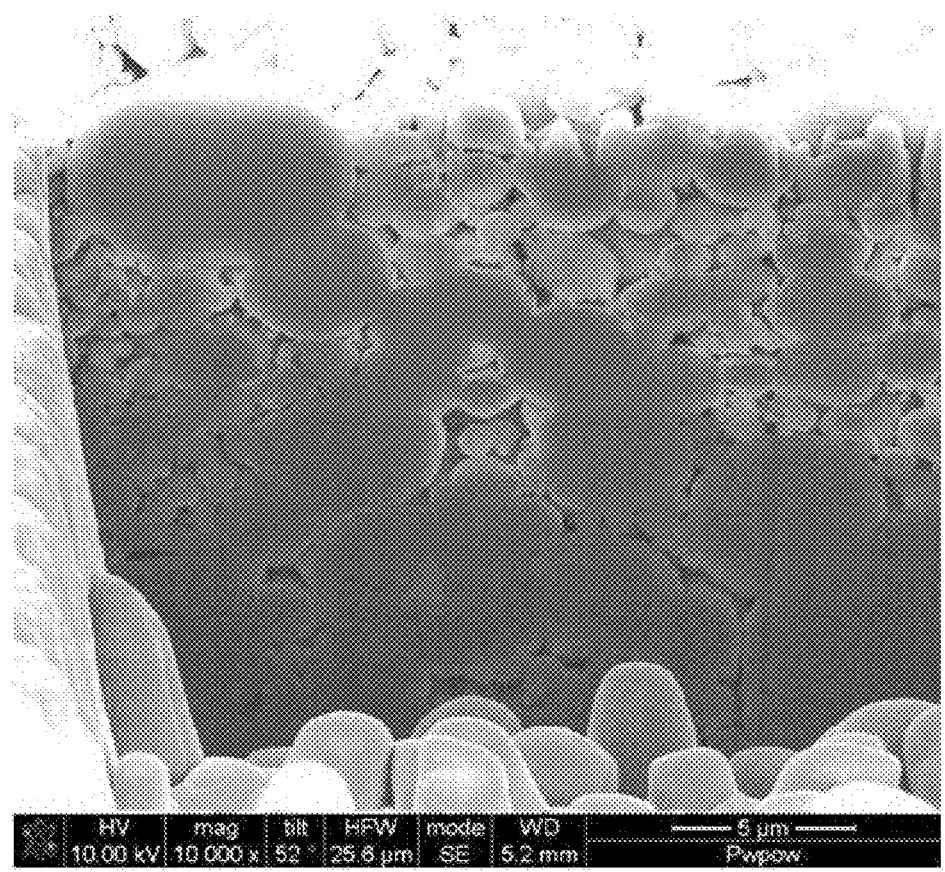

An example of metal particles, before being deformed, is shown in FIG. 5A in the form of a metal paste. As shown, gaps exist between particles. FIG. 5B illustrates metal particles that have been deformed. Deformed particles can reduce contact resistance and improve conductivity of the conductive contact and as a result, improve the performance of the solar cell. Furthermore, deformed particles can increase the cohesion of the particles and adhesion of the particles to the solar cell. Moreover, in an embodiment in which Al particles are used, deforming the Al particles can break the oxide shell around the Al particles further enhancing the deformed Al particles' conductivity. When particles are deformed, the particle to particle contact area increases, thus aiding interdiffusion of atoms during sintering, which ultimately improves the conductivity and cohesion of the particles. FIGS. 5C-5E illustrate various examples of cross-sections of a metal contact with deformed metal particles. Note the coalescing of the deformed particles in the examples of FIGS. 5C-5E thereby improving the performance of the conductive contact.

In various embodiments, the metal particles can have a thickness of approximately 1-500 microns. For example, for an embodiment in which the metal particles are printed, the printed metal particles can have a thickness of approximately 1-10 microns. In an embodiment in which the metal particles are deposited as a metal powder, the metal particle layer can have a thickness of approximately 1-500 microns (e.g., 80 microns, etc.). In metal powder embodiments, the deformed metal particle layer may be a sufficient thickness such that plating of additional metal (e.g., Ni layer 132 and/or Cu layer 134 as shown in FIG. 1A) may not be required. Example conductive contacts that do not include additional plated metal on deformed metal particles 130 are shown in FIGS. 1C and 1D.

To provide context, printed paste or deposited powder may be used as a low cost seed for subsequent metal plating operations for solar cell metallization or provide sufficient conductivity to not require subsequent metal plating operations. For example, the metal particles (e.g., paste or powder) applied in a pattern (e.g., a pre-determined pattern consistent with the fingers or contact regions for the solar cell) such that the metal particles do not have to subsequently be masked and etched to form the pattern. Accordingly, printed seed paste or deposited powder may provide a higher throughput lower cost technique than sputtered metal.

In various embodiments, the metal particles can be fired (before and/or after the metal particles are deformed), also referred to as sintering, to coalesce the metal particles together, which can enhance conductivity and reduce line resistance thereby improving the performance of the solar cell. Note that some amount of coalescing of the particles can also occur in the process of deforming the particles. As described herein, the disclosed structures and techniques can improve the electrical properties of the conductive contact of a solar cell and/or reduce cost.

In various embodiments, Ni layer 132 and Cu layer 134 can be plated according to an electroless or electrolytic plating technique. In other embodiments, other deposition techniques may be used to deposit the nickel and/or copper, respectively.

Figure 1B:
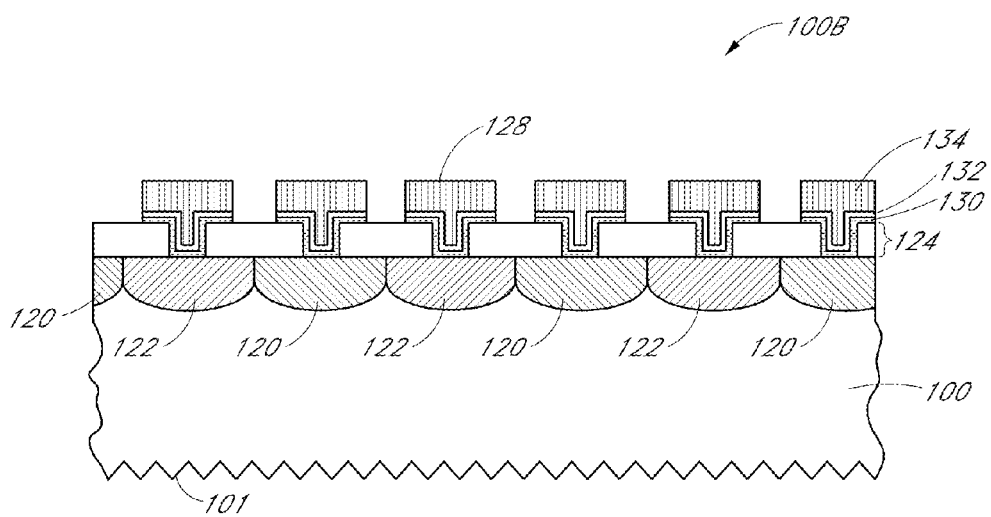
FIGS. 1B and 1D illustrate cross-sectional views of a portion of example solar cells having conductive contacts formed on emitter regions formed in a substrate, according to some embodiments.
Figure 1C:
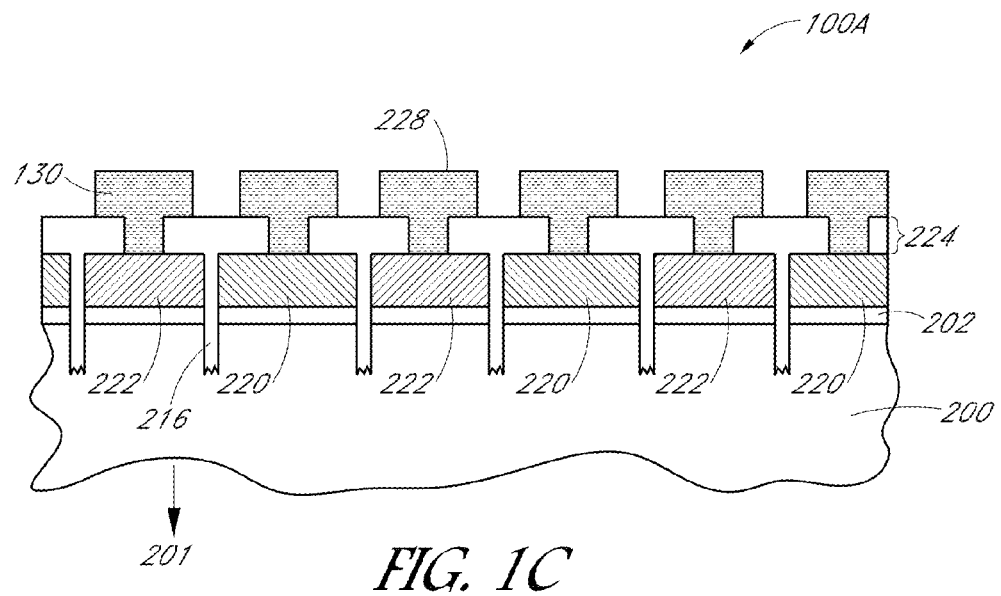
Figure 1D:
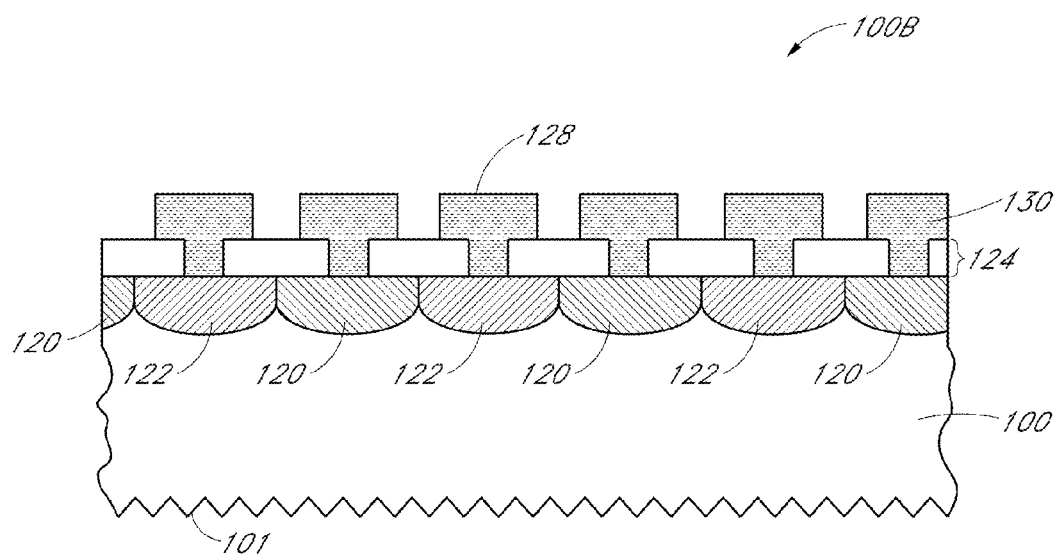

Turning now to FIG. 1B, a cross-sectional view of a portion of an example solar cell having conductive contacts formed on emitter regions formed in a substrate is illustrated, according to one embodiment. For example, in this second exemplary cell, metal particles are used to fabricate contacts, such as back-side contacts, for a solar cell having emitter regions formed in a substrate of the solar cell.

As shown in FIG. 1B, a portion of solar cell 100B includes patterned dielectric layer 124 disposed above a plurality of n-type doped diffusion regions 120, a plurality of p-type doped diffusion regions 122, and on portions of substrate 100, such as a bulk crystalline silicon substrate. Conductive contacts 128 are disposed in a plurality of contact openings disposed in dielectric layer 124 and are coupled to the plurality of n-type doped diffusion regions 120 and to the plurality of p-type doped diffusion regions 122. In an embodiment, diffusion regions 120 and 122 are formed by doping regions of a silicon substrate with n-type dopants and p-type dopants, respectively. Furthermore, the plurality of n-type doped diffusion regions 120 and the plurality of p-type doped diffusion regions 122 can, in one embodiment, provide emitter regions for solar cell 100B. Thus, in an embodiment, conductive contacts 128 are disposed on the emitter regions. In an embodiment, conductive contacts 128 are back contacts for a back-contact solar cell and are situated on a surface of the solar cell opposing a light receiving surface, such as opposing a texturized light receiving surface 101, as depicted in FIG. 1B.

In one embodiment, referring again to FIG. 1B and similar to that of FIG. 1A, conductive contacts 128 can include a conductive layer of deformed metal particles 130 and in some embodiments, can also include nickel (Ni) layer 132, and copper (Cu) layer 134. As described herein, metal particles 130 can be deposited on the silicon substrate in the form of a metal paste or a metal powder and can be deformed.

Turning now to FIG. 1C, the illustrated solar cell includes the same features as the solar cell of FIG. 1A except that the example solar cell of FIG. 1C does not include the additional plated metal (e.g., Ni and Cu layers). Instead, deformed metal particles 130 are sufficiently thick (e.g., approximately 80 microns) to provide adequate conductivity for the cell and can operate as conductive contact 228 without added plated metal. Note that although deformed metal particles may not include additional plated metal, deformed metal particles 130 may include multiple layers of deformed metal particles. For example, as described herein, deformed metal particles 130 may include a first layer of deformed metal particles (e.g., Al particles) closest to the substrate and a second layer of deformed metal particles (e.g., Cu particles, tin particles, etc.). Use of two different types of deformed metal particles may allow for the use of a first metal type that is better suited to adhere and conduct relative to the substrate and a second metal type that is better suited for soldering (e.g., to interconnect cells).

Turning now to FIG. 1D, the illustrated solar cell includes the same features as the solar cell of FIG. 1B except that the example solar cell of FIG. 1D does not include the additional plated metal (e.g., Ni and Cu layers). Also similar to the example solar cell of FIG. 1C, the solar cell of FIG. 1D can include deformed metal particles 130 that are sufficiently thick as conductive contact 228 without the need for additional plated metal.

Although certain materials are described herein, some materials may be readily substituted with others with other such embodiments remaining within the spirit and scope of embodiments of the present disclosure. For example, in an embodiment, a different material substrate, such as a group III-V material substrate, can be used instead of a silicon substrate. As another example, in one embodiment, silver (Ag) particles, conductive carbon, tin, or the like can be used as metal particles in addition to or instead of Al particles. In another embodiment, plated or like-deposited cobalt (Co) or tungsten (W) can be used instead of or in addition to the Ni layer described above. As is the case with the Ni layer, the Co or W may be fired resulting in the first conductive portions.

Note that, in various embodiments, the formed contacts need not be formed directly on a bulk substrate, as was described in FIGS. 1B and 1D. For example, in one embodiment, conductive contacts such as those described above are formed on semiconducting regions formed above (e.g., on a back side of) as bulk substrate, as was described for FIGS. 1A and 1C.

Figure 2A:
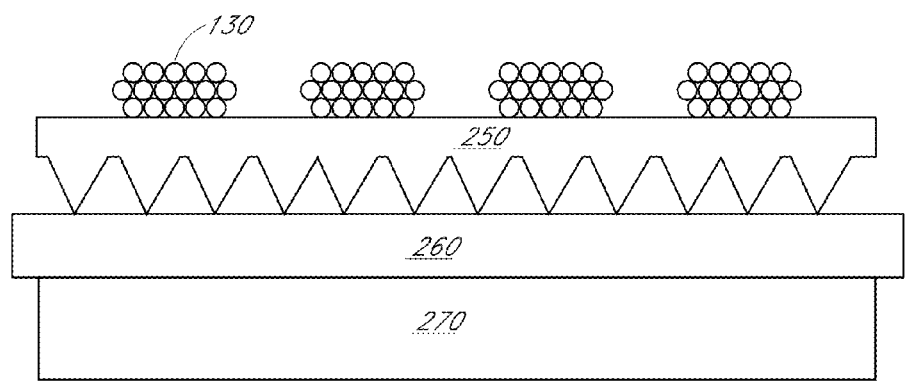
FIGS. 2A-2D, 3A-3D, and 4A-4C illustrate cross-sectional views of example sequences of forming conductive contacts, according to some embodiments.

Turning now to FIGS. 2A-2D, cross-sectional views of an example sequence of forming a conductive contact are shown. As shown in FIG. 2A, metal particles 130 can be deposited on substrate 250. In the illustrated example, metal particles 130 are a metal paste, such as a paste that includes Al particles. In other examples, the paste can include other conductive particles (including non-metal conductive particles) instead of or in addition to Al particles as well as other substances, such as a binder. The paste can be printed (or deposited in another manner) in a pre-determined pattern, such as a pattern for the fingers of a solar cell.

Also as shown in FIG. 2A, the substrate may be placed on platen 270 (e.g., a steel support) to provide support for the substrate 250 for the deposition and compression of the metal particles. In the illustrated embodiment, film 260 may be placed between substrate 250 and platen 270 to protect the pyramids on the front side of the solar cell. Film 260 can be thin enough to prevent bending of the wafer during compression but dense enough to support the pyramids. Example films include polyethylene and similar films. Note that a small portion of film 260 may become embedded in some of the pyramids but may not significantly affect optics of the solar cell.

Figure 2B:
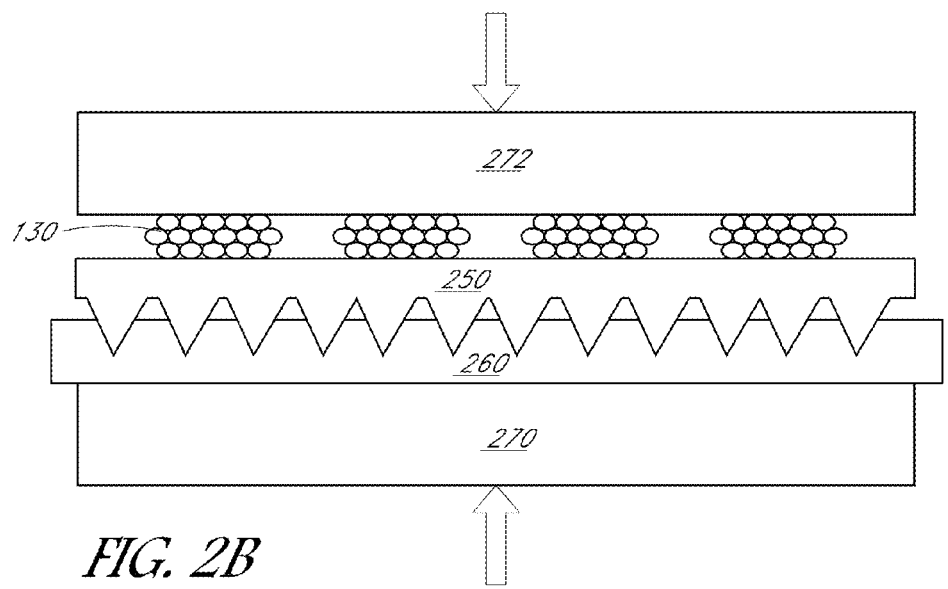

As shown by the arrows in FIG. 2B, metal particles 130 can be deformed by compressing the metal particles between platen 270 and platen 272 resulting in deformed metal particles. Note that pressure may be applied from the top, bottom, or both, in various embodiments. Although in the example of FIG. 2B, deformation is caused by compression between platens, other techniques to deform the metal particles may be applied. For example, the metal particles can be deformed by running the substrate, film, and metal particles under a roller to compress the particles. As another example, the metal particles can be deformed by burnishing the metal particles, for example by pressing a hard surface into and dragged across the surface of the metal particles.

In one embodiment, one or more of the platens, rollers, or burnishing tool can be heated, for example, at approximately 300-400 degrees Celsius, such that the particles can be heated and softened as they are mechanically deformed.

Figure 2C:
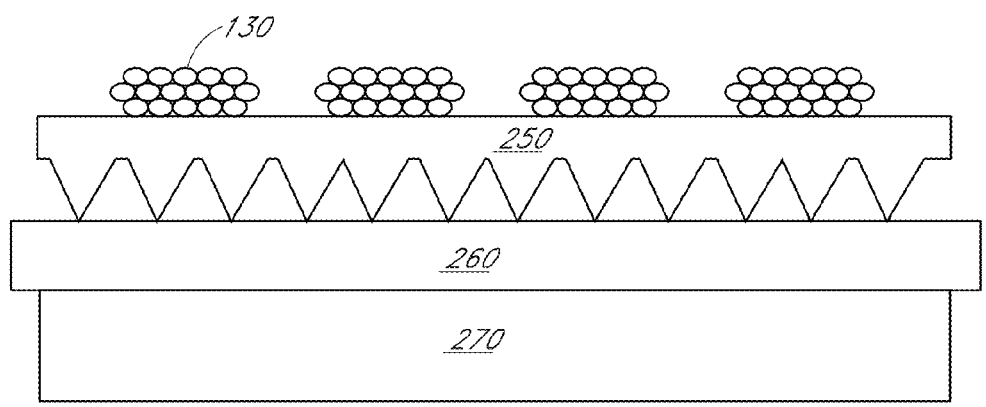

As shown in FIG. 2C, the top platen can be removed with the resulting metal particles being deformed and remaining in the printed pattern. Deforming the particles can cause the particles to adhere to one another and to the substrate better and decrease line resistance, thereby enhancing conductivity and solar cell performance. As noted above, the deformed metal particles can remain in the finger pattern as the metal paste was printed such that subsequent patterning and etching is not needed.

Figure 2D:
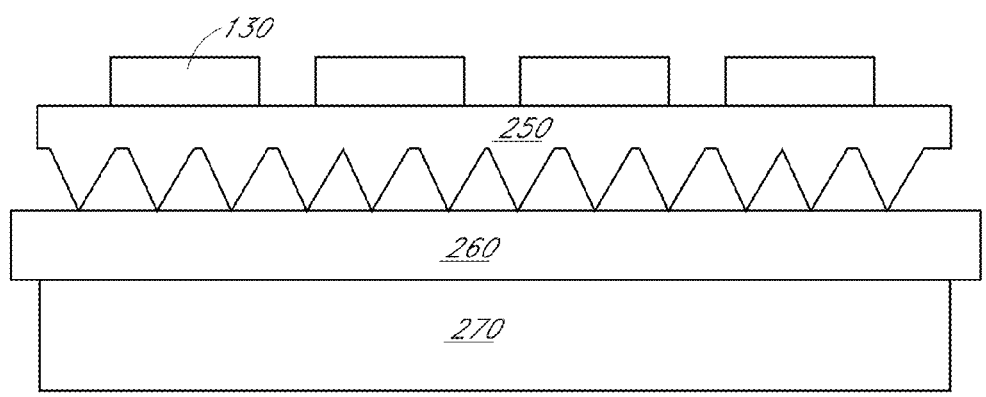

FIG. 2D illustrates further coalescence of the metal particles (as shown by the rectangular metal particles 130) by firing the particles, for example at a temperature of 500 degrees Celsius. Note that the temperature, pressure, and/or duration of firing can depend on the underlying type metal particles. For example, for Al particles, the temperature may be below the eutectic temperature (577 degrees Celsius) to prevent alloying of the Al with the silicon of the substrate. For instance, the annealing/firing temperature of Al can be a different temperature than the annealing/firing temperature of Cu.

Although the example of FIGS. 2A-2D illustrates firing the metal particles after compression, in other examples, the metal particles can be fired before compressing the particles. Further, in some embodiments, multiple firings and multiple compressions can occur to further coalesce the metal particles.

Figure 3A:
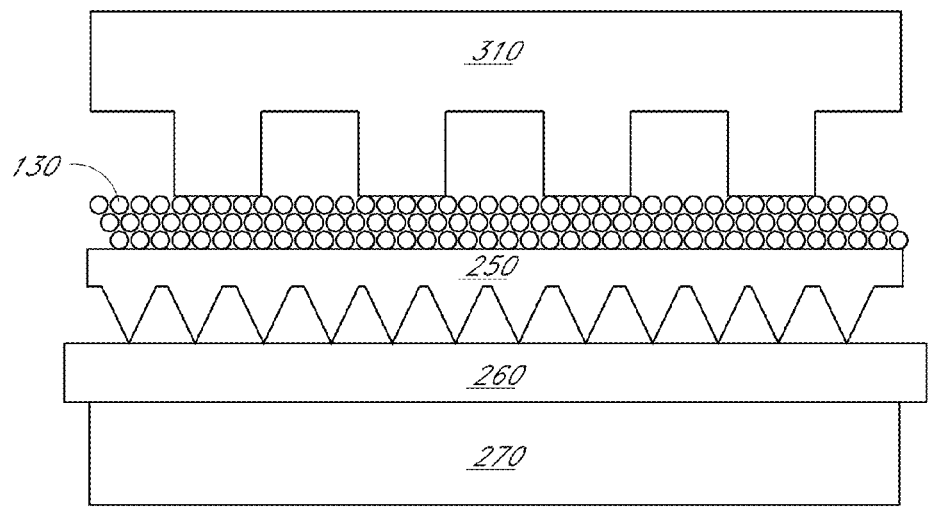
Figure 3B:
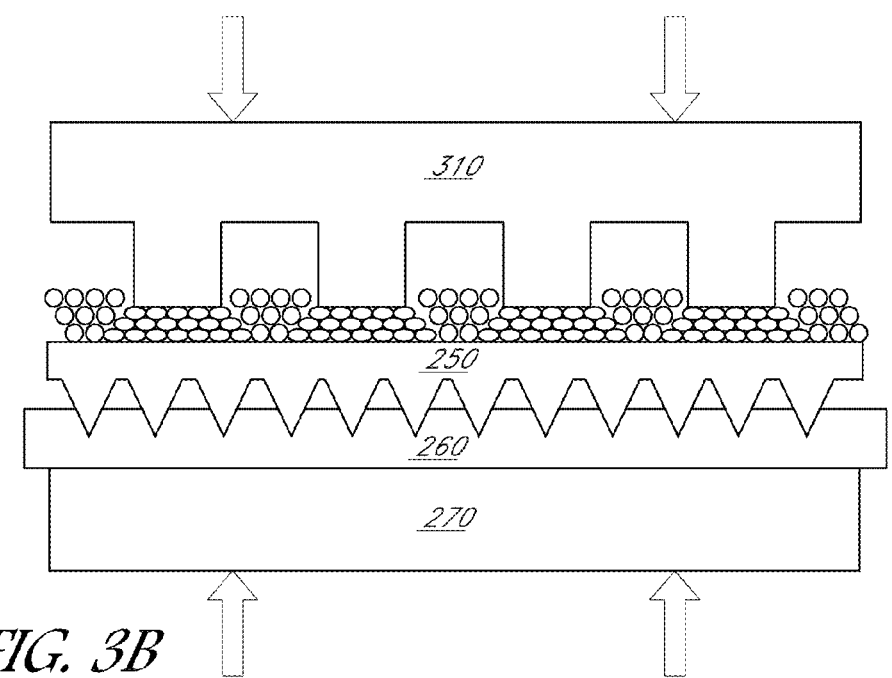

FIGS. 3A-3D illustrate cross-sectional views of another example sequence of forming a conductive contact. As shown in FIG. 3A, metal particles 130 are applied to substrate 250 in the form of a layer of metal powder. In contrast to FIGS. 2A-2D, the top platen in FIG. 3A is patterned as shown by patterned die 310. For example, patterned die 310 may be patterned in a finger pattern. As pressure is applied by the patterned die, lower platen, or both as shown by the arrows in FIG. 3B, the patterned portions of the patterned die can deform the metal powder that are positioned between the patterned portions and the substrate such that the resulting deformed particles are in the pattern of the patterned die. The deformed metal powder particles can adhere to one another and to the substrate as a result of the compression. The metal powder that is not deformed by the patterned die may not be sufficiently adhered to one another or to the substrate such that that non-deformed powder can easily be removed (e.g., shaken off, blown off) from the substrate leaving the patterned deformed metal particles on the substrate.

Figure 3C:
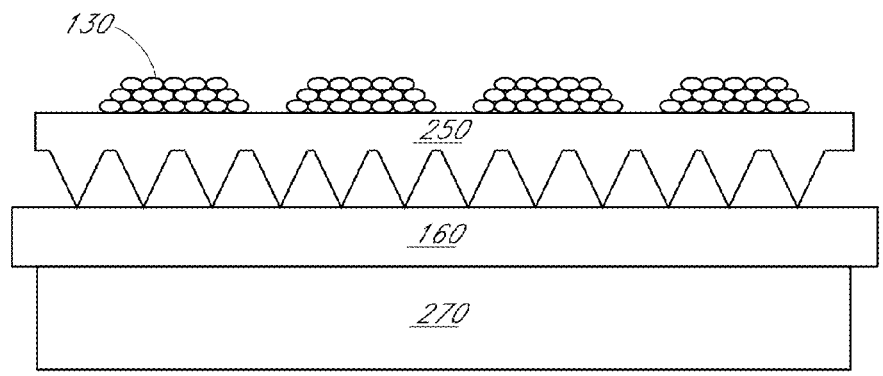
Figure 3D:
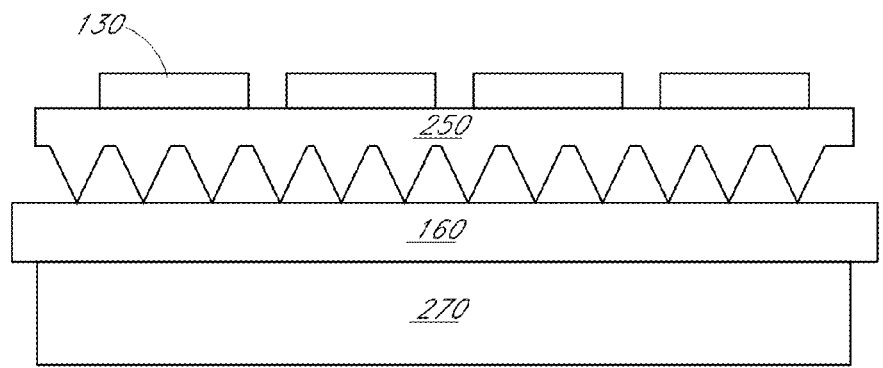

FIG. 3C illustrates the deformed metal particles 130 adhered to substrate 250 with the metal powder that was not deformed removed from the substrate. Similar to FIG. 2D, FIG. 3D illustrates the deformed metal particles further coalesced by firing/annealing the deformed metal particles. As noted above, although FIGS. 2D and 3D illustrate the result of firing the metal particles after deforming them, the metal particles may be fired before deforming them. Additionally, firing and deforming or deforming and firing can be performed iteratively (e.g., the metal particles can be fired, deformed, fired again, deformed again, etc.).

Figure 4A:
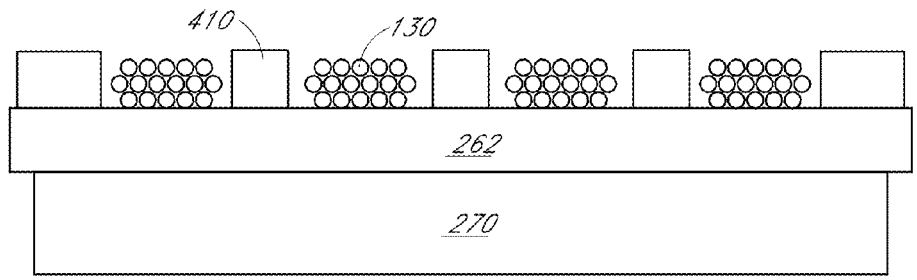
Figure 4B:
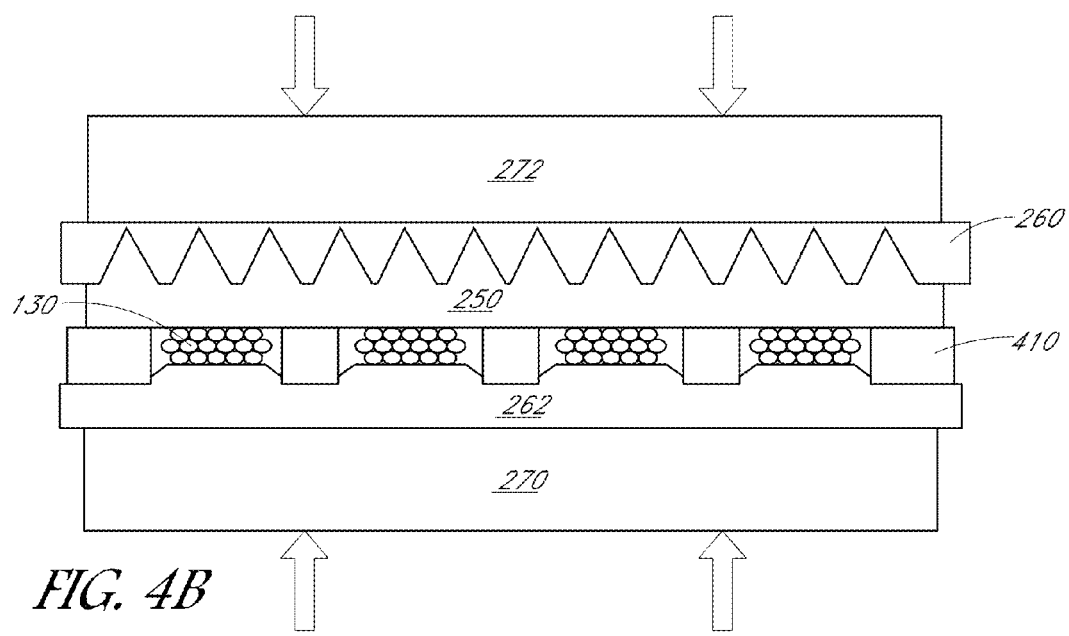
Figure 4C:
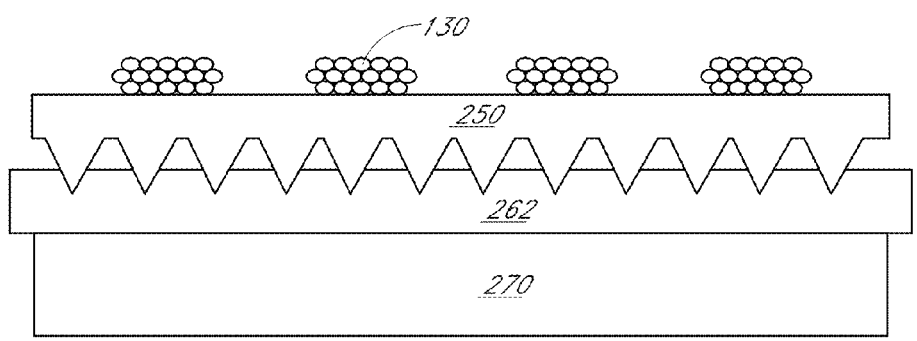

FIGS. 4A-4C illustrate cross-sectional views of another example sequence of forming a conductive contact. As shown in FIG. 4A, metal particles 130 are applied to substrate 250 in the form of a layer of metal powder. In contrast to FIGS. 3A-3D, the metal powder in FIG. 4A is applied through a patterned mold or stencil, such as mold 410. For example, the pattern of the mold can be a finger pattern such that metal powder is loaded into the mold onto the film 262 (which can be the same type of film as film 260) in a finger pattern. Note that during loading of the particles into the mold, the particles can be at least partially deformed as they pass through the mold.

As shown in FIG. 4B, substrate 250 and film 260 can be placed upside down (relative to the configuration shown in FIGS. 3A-3D) on mold 410 and metal particles 130. Platens 270 and 272 can apply pressure such that metal particles 130 are deformed and adhere to substrate 250.

As illustrated in FIG. 4C, substrate 250 with adhered deformed metal particles 130 can be flipped upside down relative to the configuration of FIGS. 4A and 4B and mold 410 and film 262 can be removed. Not illustrated in the figures, deformed metal particles 130 from FIG. 4C can be fired (as in FIG. 3C) to further coalesce the deformed metal particles. Furthermore an additional particle deformation process may be performed after the powder has been transferred to the wafer, for example the powder may be further deformed by an optionally heated platen. As described herein, in various embodiments, firing the metal particles can be performed before, after, or before and after deforming the metal particles or, in one embodiment, not at all.

Not illustrated, multiple layers of metal particles can be used in on embodiment. For example, deformed metal particles can include a layer of deformed metal particles (e.g., Al particles) closest to the substrate, and a second layer of deformed metal particles (e.g., Cu particles) on the first layer. In one embodiment, the second layer may be loaded into the lower portion of the mold followed by the first layer being deposited closest to the solar cell. Then, both layers can be deformed together as in FIG. 4B. Or, in another embodiment, the first layer of metal particles can be deposited through the mold, deformed, and then the second layer can be deposited on the deformed first layer. In such an embodiment, the deposition of the second layer need not be performed through the mold because they first layer is already formed in the pattern of the stencil and the additional layer will self-align to the topology of the already patterned layer. Accordingly, the second layer of particles can be deposited in a substantially uniform layer followed by compression between platens (e.g., as in FIG. 2B). The portion of the second layer of particles that is positioned on the patterned deformed first layer of particles will be deformed and adhere to the first layer and to one another. On the other hand, the portion of the second layer of particles positioned between fingers of the patterned first layer will not be deformed and can then be removed.

Additional embodiments that are not illustrated also exist. For example, the examples of FIGS. 2A-2D, 3A-3D, and 4A-4C can be used in combination with one another. For example, a metal paste can be used in a conductive in conjunction with a metal powder. For instance, deformed metal particles can be formed as in FIGS. 2A-2C. Following deformation of the metal particles from the metal paste, metal powder (whether same type of metal or a different type) can be deposited on the deformed metal particles of the paste. Because the particles of the metal paste can already be deformed in the desired pattern, the stencil or patterned die may not need to be used. Instead, a layer of metal powder can be deposited and can self-align to the already patterned compressed particles.

As another example, metal powder can be coated on a roller and as the roller is pressed against the wafer, the metal powder can be pressed into the already patterned layer due to the raised topology of those regions. Areas of the wafer that do not have the first patterned metal layer are further away from the hard roller surface such that the distance between the wafer and the roller is greater than the diameter of the loose metal powder particles. Accordingly, the loose particles corresponding to those areas of the wafer are not pressed into the wafer (or the first patterned metal layer).

Figure 6:
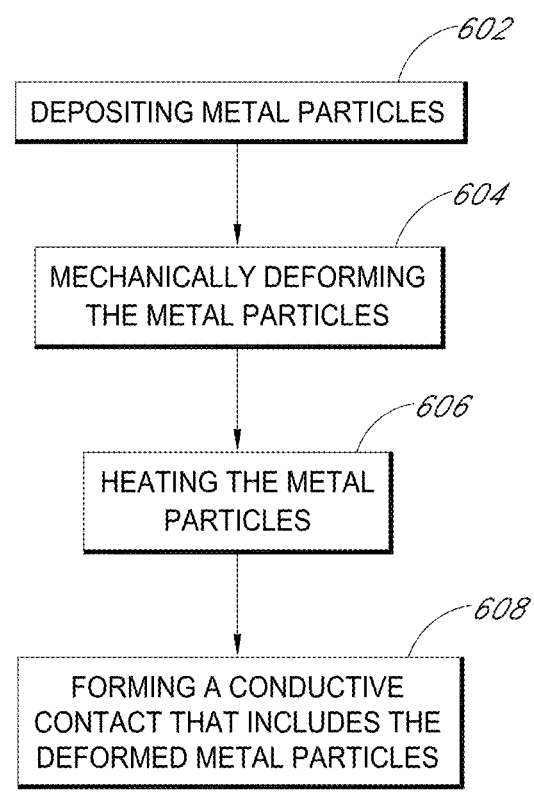
FIG. 6 is a flowchart illustrating an example method of forming a conductive contact, according to one embodiment.

Turning now to FIG. 6, a flow chart illustrating a method for forming a conductive contact is shown, according to some embodiments. In various embodiments, the method of FIG. 6 can include additional (or fewer) blocks than illustrated. For example, in some embodiments, heating the metal particles at block 606 may not be performed or may also (or instead) be performed before block 604.

As shown at 602, metal (or non-metal conductive) particles can be deposited. In various embodiments, particles can be Al particles, Cu particles, Ag particles, and/or conductive carbon particles, among other examples.

Depositing the metal particles can include printing a metal paste (e.g., in a pattern that is suitable for connectivity with respective p and n regions of a solar cell (e.g., in a predetermined finger pattern, such as an interdigitated finger pattern)) or depositing a metal powder (e.g., in a substantially uniform layer or through a mold such that the powder is deposited in the finger pattern). Note that some techniques for depositing the metal particles can also at least partially deform the particles. For example, depositing metal powder can result in deforming the metal powder particles such that the deformation at block 604 is a second deformation of the particles.

Various examples of depositing the metal particles are shown in FIGS. 2A-2D, 3A-3D, and 4A-4C and described throughout the specification. Note that although those examples illustrate depositing the metal particles for back contact solar cells, the metal particles may similarly be deposited on the front side of a solar cell for front contact solar cells.

As illustrated at 604, the metal particles can be mechanically deformed, according to various embodiments. For example, as described herein, the metal particles can be deformed by mechanical force, such as burnishing, compressing (e.g., between plates, by a roller, etc.) etc. Various examples are shown in FIGS. 2A-2D, 3A-3D, and 4A-4C. Other examples not illustrated in the figures include using a roller and/or a burnishing tool to deform the metal particles.

In various embodiments, deformation of the particles can result in adherence of the deformed particles to the substrate and to one another. For example, deforming the metal particles can cause the particles to coalesce and/or break oxide shells around the metal particles. As a result, the deformed particles can be electrically coupled to the substrate and to one another.

At 606, in one embodiment, the metal particles can be fired (e.g., heated, laser annealed, etc.). For example, firing can be performed by heating according to a temperature and/or atmosphere based on the composition of the metal particles. For instance, for particles of a metal paste that includes Al/Si alloy particles, the firing temperature may be approximately 550 degrees Celsius, such that the firing temperature is below the eutectic temperature for Al and Si. For pure Al particles, the firing temperature may be approximately 500 degrees Celsius. As described herein, the result of firing the metal particles can be further coalescing of the particles.

Moreover, heating the metal particles can result in softening the metal particles, which can provide for easier deformation in embodiments in which the metal particles are heating before deforming the particles. As described herein, blocks 604 and 606 may be performed multiple times, be performed iteratively, be perform simultaneously (e.g., heated plates compressing the particles, compressing the particles in an oven), and/or the order may be switched. For example, in one embodiment, the metal particles may be heated before the particles are deformed at block 604. In one embodiment, the metal particles may be heated after an initial deformation at block 604 but before deforming the metal particles again.

Figure 7:
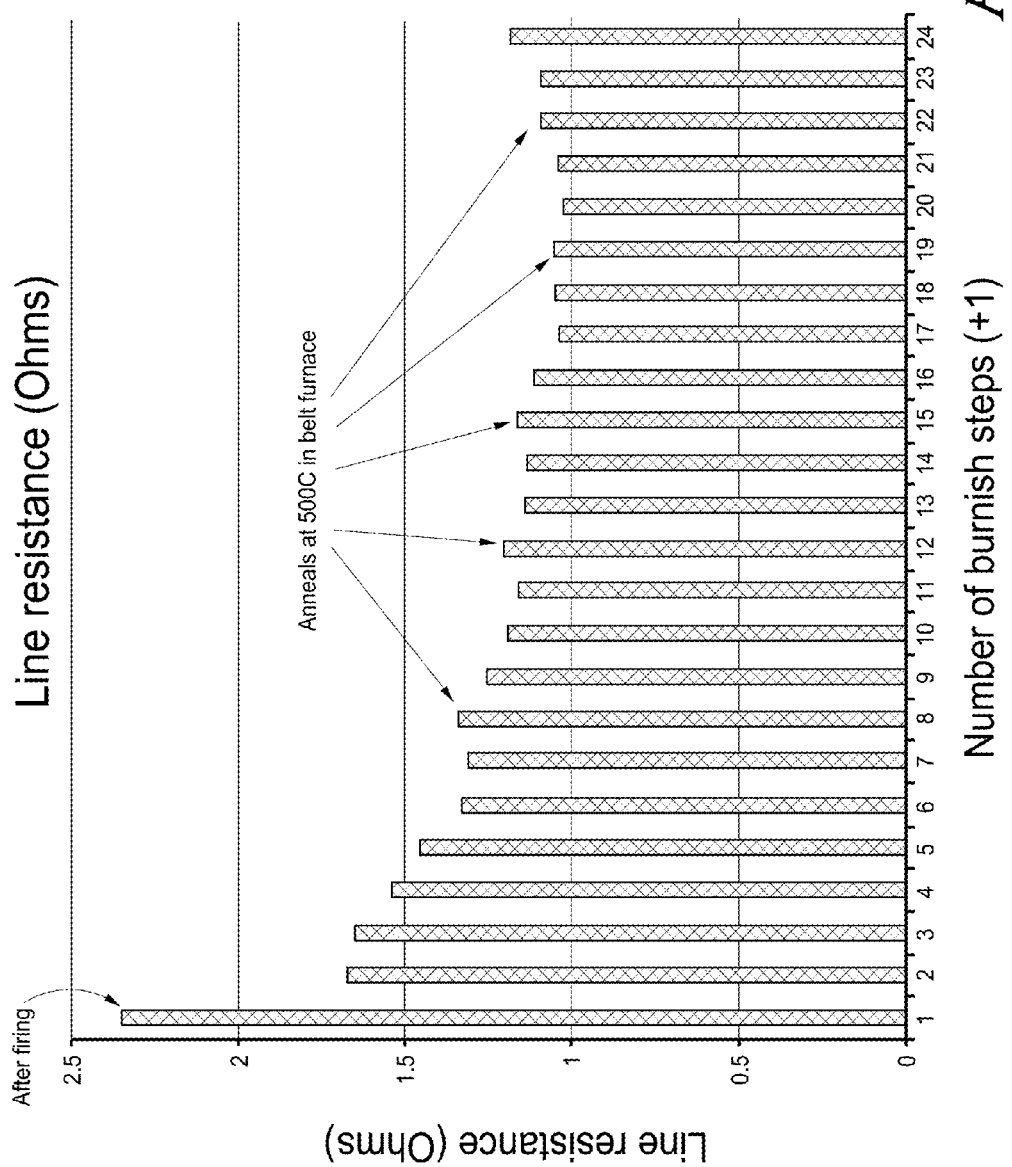
FIG. 7 illustrates an example chart illustrating line resistance of a conductive contact, according to some embodiments.

Along those lines, FIG. 7 depicts a graph illustrating the line resistance (in Ohms) of metal particles after multiple burnishing steps (multiple deformation steps) as well as a firing at the first burnishing step and an anneal in a 500 degree Celsius belt furnace at the 8th, 11th, 14th, 18th, and 21$^{st}$ burnishing. The graph illustrates, generally, that subsequent rounds of deformation at block 604 and heating at block 606 can further reduce line resistance and improve conductivity of the deformed metal particles.

Figure 8:
FIG. 8 illustrates the results of a scratch test of metal particles, according to various embodiments.

FIG. 8 illustrates the results of a scratch resistance test after various rounds of burnishing. The right most four vertical strips of Al particles were not burnished, the second vertical strip from the left was burnished once, and the left most vertical strip of Al particles was burnished sixteen times. As shown in FIG. 8, most of the Al that was not burnished was scratched away whereas less of the burnished Al was scratched away. The strip that was burnished sixteen times showed relatively little Al being scratched away thereby illustrating that multiple deformation steps can provide improved adhesion of Al to the wafer.

As illustrated at 608, a conductive contact that includes the deformed metal particles can be formed. For example, in one embodiment, one or more metal layers, such as a nickel layer and/or copper layer, can be deposited on the deformed metal particles. For example, in one embodiment, nickel and/or copper can be deposited on the metal particles according to an electroless plating technique. Note that in some embodiments, additional metal may not be plated to the deformed metal particles.

The disclosed structures and techniques can improve the electrical properties of conductive contacts. For example, by deforming metal particles according to the disclosed structures and techniques, contact resistance can be decreased, and adhesion and conductivity can be improved. Additionally, deforming the metal particles can reduce porosity and therefore also function as a barrier layer to copper diffusion in an embodiment in which copper is plated to the particles.

Moreover, by deforming the metal particles and reducing contact resistance, firing can be performed at a lower temperature thereby reducing damage to the wafer than can occur at higher temperatures.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A solar cell, comprising:
   a substrate;
   a semiconductor region disposed in or above the substrate; and
   a conductive contact disposed on the semiconductor regions, wherein the conductive contact includes a plurality of mechanically deformed Al particles and a copper layer directly on the deformed Al particles; wherein the plurality of mechanically deformed Al particles are configured such that the oxide shells around the Al particles break during mechanical deformation and increases the contact between the Al particles by reducing the pores between the Al particles to form a copper diffusion barrier layer.

2. The solar cell of claim 1, wherein the mechanically deformed metal particles include mechanically deformed metal powder particles without binder materials.

3. The solar cell of claim 1, wherein the mechanically deformed metal particles include mechanically deformed metal particles with additional binder materials.

* * * * *